(12) United States Patent
Chen (10) Patent No.: US 12,254,916 B2
(45) Date of Patent: Mar. 18, 2025

(54) MEMORY DEVICE

(71) Applicant: NANYA TECHNOLOGY CORPORATION, New Taipei (TW)

(72) Inventor: Chih-Jen Chen, Kaohsiung (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 230 days.

(21) Appl. No.: 18/078,106

(22) Filed: Dec. 9, 2022

(65) Prior Publication Data
US 2024/0194240 A1    Jun. 13, 2024

(51) Int. Cl.
G11C 7/00       (2006.01)
G11C 11/406    (2006.01)
G11C 11/4074   (2006.01)

(52) U.S. Cl.
CPC .. G11C 11/40615 (2013.01); G11C 11/40618 (2013.01); G11C 11/4074 (2013.01)

(58) Field of Classification Search
CPC ........ G11C 11/40615; G11C 11/40618; G11C 11/4074
USPC .................................................... 365/226, 96
See application file for complete search history.

(56) References Cited

U.S. PATENT DOCUMENTS

| | | | | |
|---|---|---|---|---|
| 6,437,959 B1 * | 8/2002 | Andrieu | ............ | G11C 8/20 361/103 |
| 6,548,884 B2 * | 4/2003 | Oikawa | ............ | G11C 17/16 438/281 |
| 6,639,848 B2 * | 10/2003 | Maejima | ............ | G11C 29/44 365/201 |
| 6,870,783 B2 * | 3/2005 | Kwak | ............ | G11C 29/46 365/201 |
| 7,269,070 B2 * | 9/2007 | Kim | ............ | G11C 16/30 365/185.11 |
| 7,432,837 B2 * | 10/2008 | Wong | ............ | H04L 25/06 341/120 |
| 7,936,582 B1 * | 5/2011 | Zhou | ............ | G11C 17/18 365/96 |
| 8,193,851 B2 * | 6/2012 | Kim | ............ | G11C 17/18 327/525 |
| 8,208,336 B2 * | 6/2012 | Do | ............ | G11C 17/14 365/210.1 |
| 8,274,321 B2 * | 9/2012 | Chi | ............ | G11C 29/785 326/38 |

(Continued)

FOREIGN PATENT DOCUMENTS

| | | |
|---|---|---|
| TW | 459240 | 10/2001 |
| TW | 202032569 | 9/2020 |
| WO | 2019213031 | 11/2019 |

OTHER PUBLICATIONS

"Office Action of Taiwan Counterpart Application", issued on Feb. 20, 2024, p. 1-p. 6.

*Primary Examiner* — Viet Q Nguyen
(74) *Attorney, Agent, or Firm* — JCIPRNET (57) ABSTRACT

The memory device of the disclosure includes a fuse voltage generator, a fuse storage and a logic circuit. The fuse voltage generator generates a fuse voltage in response to an enable signal having a first logic level, and stop generating the fuse voltage in response to the enable signal having a second logic level. The fuse storage storages a setting data of the memory device. The fuse storage outputs the setting data in response to the fuse voltage. The logic circuit generates the enable signal in response to at least two operating signals.

11 Claims, 5 Drawing Sheets

(56) References Cited

U.S. PATENT DOCUMENTS

| | | | | |
|---|---|---|---|---|
| 8,289,070 | B2* | 10/2012 | Huang | G11C 29/027 |
| | | | | 327/525 |
| 8,330,527 | B2* | 12/2012 | Kim | G11C 17/18 |
| | | | | 327/525 |
| 8,686,786 | B2* | 4/2014 | Park | G11C 17/18 |
| | | | | 327/536 |
| 8,717,834 | B2* | 5/2014 | Hwang | G11C 29/785 |
| | | | | 365/189.11 |
| 8,767,490 | B2* | 7/2014 | Jang | G11C 17/16 |
| | | | | 365/201 |
| 8,780,612 | B2* | 7/2014 | Kim | G11C 13/0064 |
| | | | | 365/163 |
| 8,836,386 | B1* | 9/2014 | Hwang | H03K 17/22 |
| | | | | 327/143 |
| 9,747,113 | B2* | 8/2017 | Yoon | G06F 9/4401 |
| 10,217,525 | B2* | 2/2019 | Yoko | G11C 29/789 |
| 10,734,991 | B1* | 8/2020 | Hsu | G01R 31/74 |
| 11,056,207 | B2* | 7/2021 | Mori | G11C 17/18 |
| 11,749,366 | B2* | 9/2023 | Matsubara | G11C 29/785 |
| | | | | 365/225.7 |
| 11,955,196 | B2* | 4/2024 | Hsu | G11C 5/145 |
| 2005/0117432 | A1 | 6/2005 | Graaff et al. | |
| 2012/0274391 | A1* | 11/2012 | Kim | H01L 23/5252 |
| | | | | 327/525 |
| 2017/0117057 | A1 | 4/2017 | Park et al. | |
| 2021/0097363 | A1* | 4/2021 | Yadegari | G06K 19/0723 |

\* cited by examiner

MEMORY DEVICE

BACKGROUND

Technical Field

The disclosure generally relates to a memory device, and more particularly to a memory device including a fuse storage.

Description of Related Art

Some memory device includes a fuse storage. The fuse storage storages a setting data of the memory device. For example, setting data may include option codes or initial setting codes of the memory device. The fuse storage is driven by a fuse voltage. The fuse voltage is always provided to the fuse storage. Therefore, the fuse voltage increases a power consumption of the memory device.

SUMMARY

The disclosure provides a memory device includes a fuse storage. The memory device has a low power consumption.

The memory device of the disclosure includes a fuse voltage generator, a fuse storage and a logic circuit. The fuse voltage generator generates a fuse voltage in response to an enable signal having a first logic level, and stops generating the fuse voltage in response to the enable signal having a second logic level. The fuse storage is coupled to the fuse voltage generator. The fuse storage storages a setting data of the memory device. The fuse storage outputs the setting data in response to the fuse voltage. The logic circuit is coupled to the fuse voltage generator. The logic circuit determines a logic level of the enable signal in response to at least two operating signals.

Based on the above, the logic circuit controls the fuse voltage generator to stops generating the fuse voltage by the enable signal having the second logic level. Therefore, in at least one specific operation mode of the memory device, the fuse voltage is not generated. Thus, the memory device has a low power consumption.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

A disclosure may be understood by reference to the following detailed description, taken in conjunction with the drawings as described below. It is noted that, for purposes of illustrative clarity and being easily understood by the readers, various drawings of this disclosure show a portion of an electronic device, and certain elements in various drawings may not be drawn to scale. In addition, the number and dimension of each device shown in drawings are only illustrative and are not intended to limit the scope of a disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include". "comprise" and/or "have" are used in the description of a disclosure, the corresponding features, areas, steps, operations and/or components would be pointed to existence, but not limited to the existence of one or a plurality of the corresponding features, areas, steps, operations and/or components.

It will be understood that when an element is referred to as being "coupled to", "connected to", or "conducted to" another element, it may be directly connected to the other element and established directly electrical connection, or intervening elements may be presented therebetween for relaying electrical connection (indirectly electrical connection). In contrast, when an element is referred to as being "directly coupled to", "directly conducted to", or "directly connected to" another element, there are no intervening elements presented.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

Figure 1:
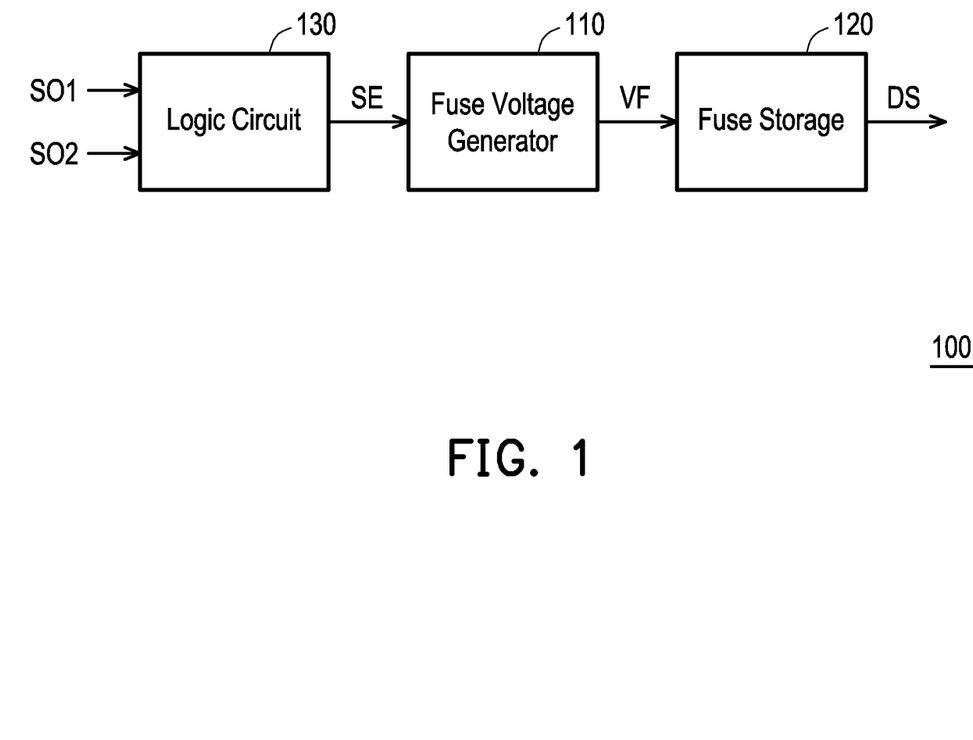
FIG. 1 illustrates a schematic diagram of a memory device according to a first embodiment of the disclosure.

Referring to FIG. 1. FIG. 1 illustrates a schematic diagram of a memory device according to a first embodiment of the disclosure. In the embodiment, the memory device 100 includes a fuse voltage generator 110, a fuse storage 120 and a logic circuit 130. The fuse voltage generator 110 generates a fuse voltage VF in response to an enable signal SE having a first logic level. The fuse voltage generator 110 stops generating the fuse voltage in response to the enable signal having a second logic level. The fuse storage 120 is coupled to the fuse voltage generator 110. The fuse storage 120 storages a setting data DS of the memory device 100. For example, setting data DS may include option codes and/or initial setting codes of a memory controller (not shown) of the memory device 100. The fuse voltage VF is a driving voltage of the fuse storage 120. In the embodiment, the fuse storage 120 may be implemented by memory circuits known to those skilled in the art.

For example, the first logic level is a high logic level "1". The second logic level is a low logic level "0". When the enable signal SE has the high logic level "1", the fuse voltage generator 110 generates the fuse voltage VF and outputs the fuse voltage VF to the fuse storage 120. The fuse storage 120 is driven by the fuse voltage VF. Therefore, the fuse storage 120 outputs the setting data DS to the memory controller (not shown) of the memory device 100 in response to the fuse voltage VF. When the enable signal SE has the low logic level "0", the fuse voltage generator 110 does not generate the fuse voltage VF. Therefore, the fuse storage 120 does not output the setting data DS.

In the embodiment, the logic circuit 130 is coupled to the fuse voltage generator 120. The logic circuit 130 generates the enable signal in response to operating signals SO1, SO2. Detailly, the logic circuit 130 may determine a logic level of the enable signal SE in response to the operating signals SO1, SO2.

For example, when the operating signals SO1 indicates that the memory device 100 operates in a refresh mode, the logic circuit 130 generates the enable signal SE having the second logic level. For example, when the operating signals SO2 indicates that the memory device 100 operates in a power-down mode, the logic circuit 130 also generates the enable signal SE having the second logic level. For example, when the operating signals SO2 indicates that the memory device 100 receives a command (for example, a write command or a read command), the logic circuit 130 also generates the enable signal SE having the second logic level.

It should be noted, in at least one specific operation mode of the memory device 100, the logic circuit 130 controls the fuse voltage generator 110 to stops generating the fuse voltage VF in response to the enable signal SE having the second logic level. Therefore, in the at least one specific operation mode of the memory device 100, the fuse voltage VF is not generated by the fuse voltage generator 110. Thus, the memory device 100 has a low power consumption.

Figure 2:
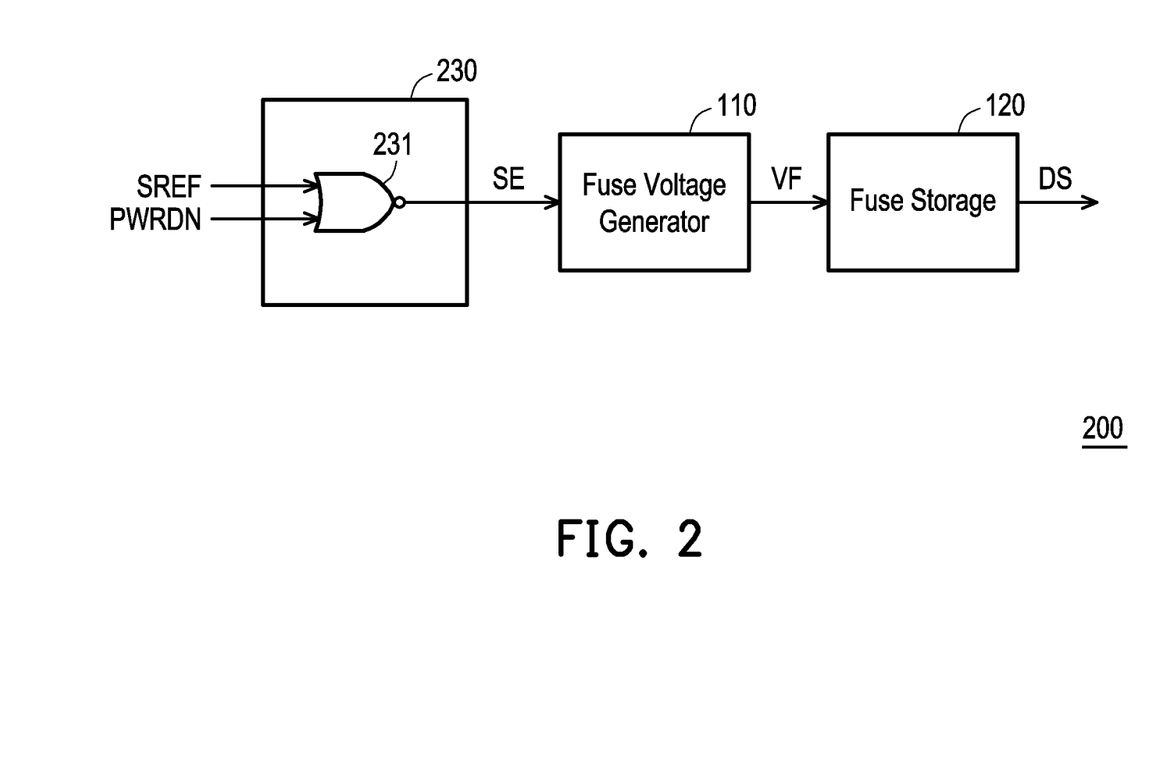
FIG. 2 illustrates a schematic diagram of a memory device according to a second embodiment of the disclosure.

Referring to FIG. 2. FIG. 2 illustrates a schematic diagram of a memory device according to a second embodiment of the disclosure. In the embodiment, the memory device 200 includes the fuse voltage generator 110, the fuse storage 120 and a logic circuit 230. The implementation details of the fuse voltage generator 110 and the fuse storage 120 have been clearly explained in the embodiment of FIG. 1, so they will not be repeated here.

In the embodiment, the logic circuit 230 generates the enable signal SE in response to the operating signals. The operating signals includes at least a refresh signal SREF and a mode signal PWRDN. The logic circuit 230 generates the enable signal SE in response to the refresh signal SREF (that is, the operating signal SO1 of FIG. 1) and the mode signal PWRDN (that is, the operating signal SO2 of FIG. 1). When the memory device 200 operates in a power-down mode, the mode signal PWRDN has the first logic level. The mode signal PWRDN is a power-down mode signal. In some embodiment, at least one of the refresh signal SREF and the mode signal PWRDN may be a state flag respectively. The power-down mode may be a sleeping mode or a low-power mode of the memory device 200. On the other hand, when the memory device 200 does not operate in the power-down mode, the mode signal PWRDN has the second logic level.

When the memory device 200 operates in any type of self-refresh mode, the refresh signal SREF has the first logic level. On the other hand, when the memory device 200 does not operate in the self-refresh mode, the refresh signal SREF has the second logic level.

In the embodiment, the logic circuit 230 generates the enable signal SE having the first logic level in response to the mode signal PWRDN having the second logic level and the refresh signal SREF having the second logic level. In other words, when the memory device 200 does not operate in the self-refresh mode and does not operate in the power-down mode, the logic circuit 230 determines the logic level of the enable signal SE as the first logic level. Therefore, the voltage generator 110 generates the fuse voltage VF in response to the enable signal SE having the first logic level.

The logic circuit 230 generates the enable signal SE having the second logic level in response to at least one of the mode signal PWRDN having the first logic level and the refresh signal SREF having the first logic level. In other words, when the memory device 200 operates in the self-refresh mode or in the power-down mode, the logic circuit 230 determines the logic level of the enable signal SE as the second logic level. The fuse voltage generator 110 stops generating the fuse voltage VF in response to the enable signal SE having the second logic level.

It should be noted, in the power-down mode, the fuse voltage generator 110 stops generating the fuse voltage VF. Therefore, the memory device 200 has very low power consumption in the power-down mode.

In the embodiment, the logic circuit 230 includes a NOR logic gate 231. A first input terminal of the NOR logic gate 231 receives the refresh signal SREF. A second input terminal of the NOR logic gate 231 receives the mode signal PWRDN. An output terminal of the NOR logic gate 231 is used to output the enable signal SE to the fuse voltage generator 110. The NOR logic gate 231 performs a NOR logic operation on the refresh signal SREF and the mode signal PWRDN to generate the enable signal SE.

Figure 3:
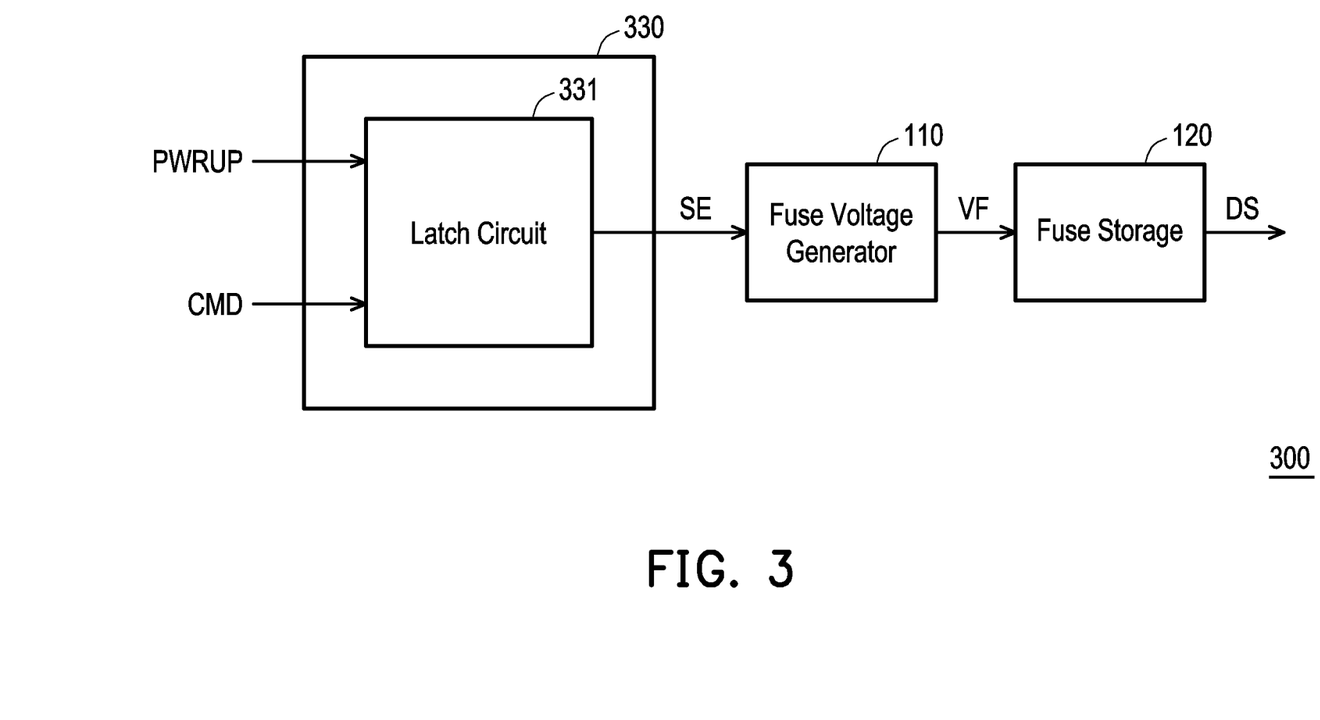
FIG. 3 illustrates a schematic diagram of a memory device according to a third embodiment of the disclosure.

Referring to FIG. 3. FIG. 3 illustrates a schematic diagram of a memory device according to a third embodiment of the disclosure. In the embodiment, the memory device 300 includes the fuse voltage generator 110, the fuse storage 120 and a logic circuit 330. The implementation details of the fuse voltage generator 110 and the fuse storage 120 have been clearly explained in the embodiment of FIG. 1, so they will not be repeated here. In the embodiment, the logic circuit 330 generates the enable signal SE in response to the operating signals. The operating signals includes at least an operating command signal CMD and a mode signal PWRUP. The logic circuit 330 generates the enable signal SE in response to the mode signal PWRUP (that is, the operating signal SO1 of FIG. 1) and the operating command signal CMD (that is, the operating signal SO2 of FIG. 1). The operating command signal CMD may be a write command, a read command, an interrupt command or refresh command. The mode signal PWRUP is a power-up mode signal. The power-up mode may be a wake-up mode from the power-down mode of the memory device 300. In some embodiment, at least one of the operating command signal CMD and the mode signal PWRUP may be a state flag respectively.

When the memory device 300 operates in the power-up mode, the mode signal PWRUP has the second logic level. On the other hand, when the memory device 300 completes the power-up mode, the mode signal PWRUP has the first logic level.

When the memory device 300 does not receive the operating command signal CMD, the logic circuit 330 generates the enable signal SE having the first logic level. On the other hand, when the memory device 300 receives the operating command signal CMD after completing the power-up mode, the logic circuit 330 generates the enable signal SE having the second logic level.

In the embodiment, when the memory device 300 operates in the power-up mode, the logic circuit 330 generates the enable signal SE having the first logic level. On the other hand, when the memory device 300 receives the operating command signal CMD after completing the power-up mode, the logic circuit 330 generates the enable signal SE having the second logic level. In other words, when the memory device 300 operates in the power-up mode, the logic circuit 330 determines the logic level of the enable signal SE as the first logic level. When the memory device 300 receives the operating command signal CMD after completing the power-up mode, the logic circuit 330 determines the logic level of the enable signal SE as the second logic level.

In the embodiment, the logic circuit 330 includes a latch circuit 331. A first input terminal of the latch circuit 331 receives the mode signal PWRUP. A second input terminal of the latch circuit 331 receives the operating command signal CMD. An output terminal of the latch circuit 331 is used to output the enable signal SE to the fuse voltage generator 110. The logic circuit 330 generates the enable signal SE in response to the mode signal PWRUP and the operating command signal CMD by a latch circuit 331.

Figure 4:
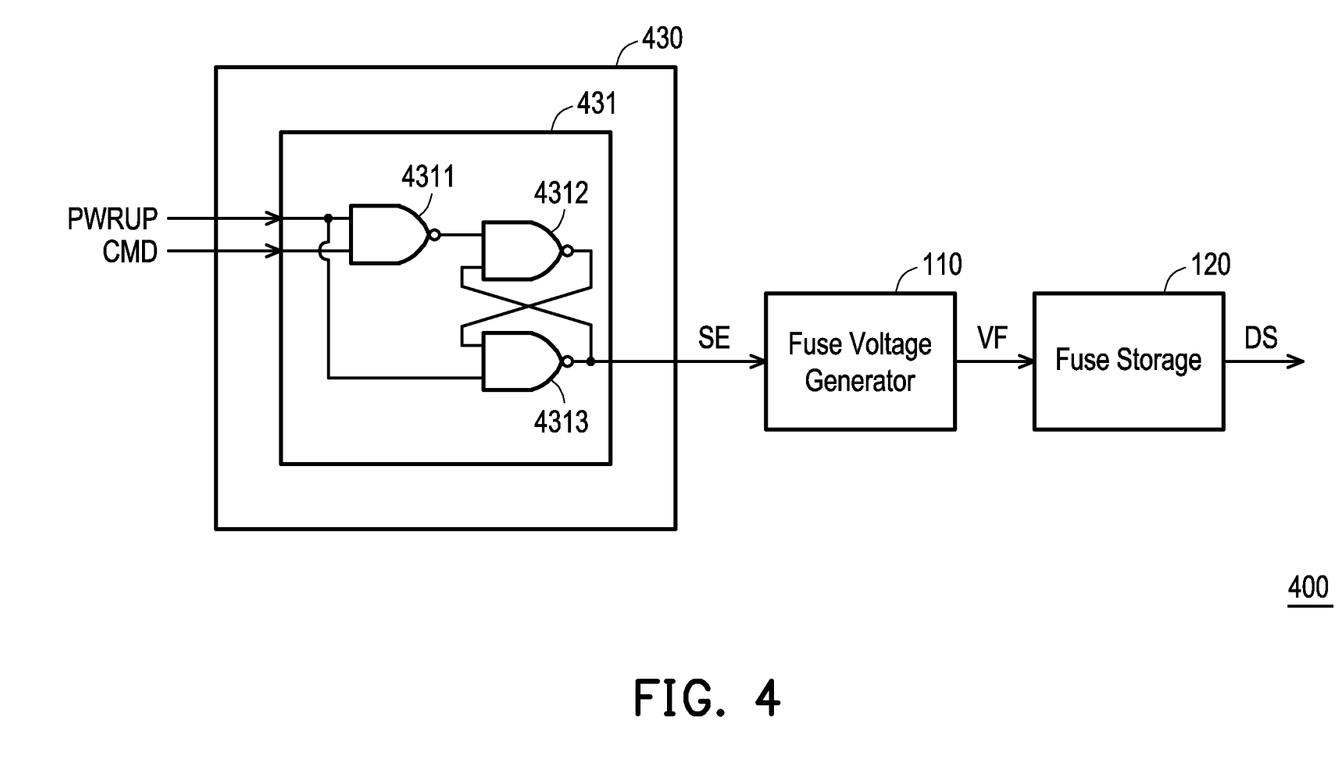
FIG. 4 illustrates a schematic diagram of a memory device according to a fourth embodiment of the disclosure.

Referring to FIG. 4, FIG. 4 illustrates a schematic diagram of a memory device according to a fourth embodiment of the disclosure. In the embodiment, the memory device 400 includes the fuse voltage generator 110, the fuse storage 120 and a logic circuit 430. The implementation details of the fuse voltage generator 110 and the fuse storage 120 have been clearly explained in the embodiment of FIG. 1, so they will not be repeated here. In the embodiment, the logic circuit 430 includes a latch circuit 431. The logic circuit 430 generates the enable signal SE in response to the mode signal PWRUP and the operating command signal CMD by the latch circuit 431.

In the embodiment, the latch circuit 431 includes NAND logic gates 4311, 4312 and 4313. A first input terminal of the NAND logic gate 4311 receives the mode signal PWRUP. A second input terminal of the NAND logic gate 4311 receives the operating command signal CMD. A first input terminal of the NAND logic gate 4312 is coupled to an output terminal of the NAND logic gate 4311. A first input terminal of the NAND logic gate 4313 is coupled to an output terminal of the NAND logic gate 4312. A second input terminal of the NAND logic gate 4313 receives the mode signal PWRUP. An output terminal of the NAND logic gate 4313 is coupled to a second input terminal of the NAND logic gate 4312 and the fuse voltage generator 110.

Figure 5:
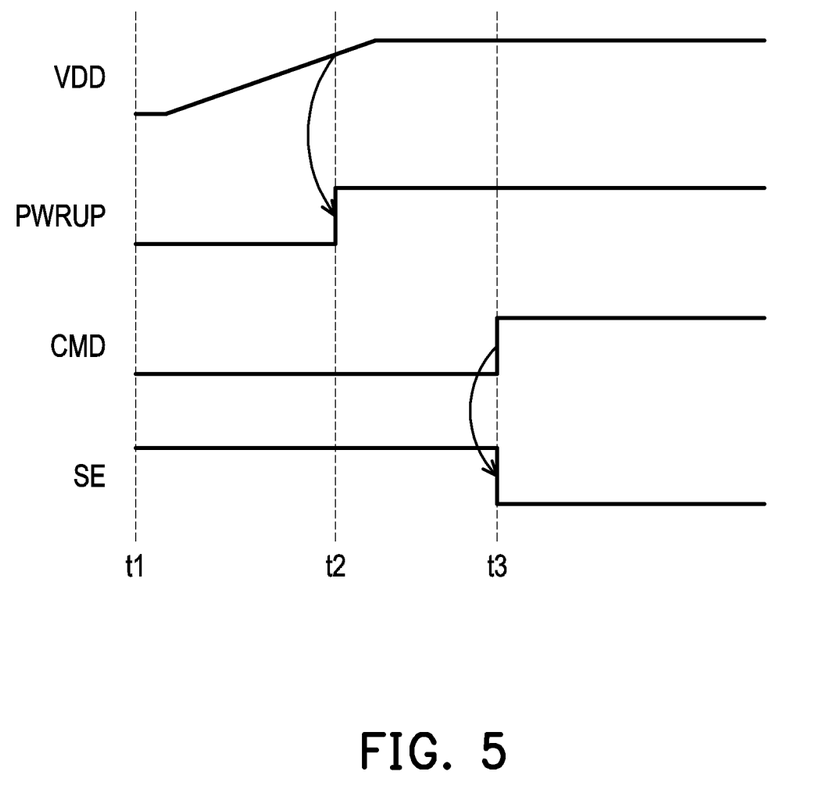
FIG. 5 illustrates a timing diagram of signals according to an embodiment of the disclosure.

Referring to FIG. 4 and FIG. 5, FIG. 5 illustrates a timing diagram of signals according to an embodiment of the disclosure. When the memory device 400 operates in the power-up mode between a time point t1 and a time point t2, a power voltage VDD is raised up. The mode signal PWRUP has the second logic level (that is, the low logic level "0"). Therefore, the NAND logic gate 4311 outputs a signal having the high logic level "1". The second input terminal of the NAND logic gate 4313 receives the mode signal PWRUP having the low logic level "0". Therefore, the logic level of the enable signal SE is maintained as the high logic level "1". The NAND logic gate 4312 outputs a signal having the low logic level "0". The fuse voltage generator 110 is enabled in response to the enable signal SE having the high logic level "1".

The memory device 400 completes the power-up mode, the second logic level of the mode signal PWRUP is transited to the first logic level when the power voltage VDD reaches to a default voltage. The second input terminal of the NAND logic gate 4313 receives the mode signal PWRUP having the high logic level "1". The memory device 400 does not receive any operating command signal CMD between the time point t2 and a time point t3. Therefore, the operating command signal CMD has the second logic level. The NAND logic gate 4311 still output the signal having the high logic level "1". The NAND logic gates 4312 and 4313 operate in a "No change" state. In other words. The NAND logic gates 4312 and 4313 storage the logic level. Therefore, the logic level of the enable signal SE is maintained as the high logic level "1". The fuse voltage generator 110 is enabled.

At the time point t3, the memory device 400 receives the operating command signal CMD after completing the power-up mode. Therefore, the operating command signal CMD has the first logic level. The NAND logic gate 4311 outputs a signal having the low logic level "0". The second input terminal of the NAND logic gate 4313 receives the mode signal PWRUP having the high logic level "1". Therefore, the logic level of the enable signal SE is transited to the low logic level "0". The fuse voltage generator 110 is disabled in response the enable signal SE having the low logic level "0". In other words, in the embodiment, the fuse voltage generator 110 is disabled when the memory device 400 receives the operating command signal CMD after completing the power-up mode.

In view of the foregoing, in at least one specific operation mode of the memory device, the logic circuit controls the fuse voltage generator to stops generating the fuse voltage in response to the enable signal having the second logic level. Therefore, in the at least one specific operation mode, the fuse voltage is not generated by the fuse voltage generator. Therefore, the memory device has a low power consumption.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory device, comprising:
a fuse voltage generator, configured to generate a fuse voltage in response to an enable signal having a first logic level, and stop generating the fuse voltage in response to the enable signal having a second logic level;
a fuse storage, coupled to the fuse voltage generator, configured to storage a setting data of the memory device, and output the setting data in response to the fuse voltage; and
a logic circuit, coupled to the fuse voltage generator, configured to determine a logic level of the enable signal in response to at least two operating signals,
wherein the at least two operating signal includes a refresh signal and a mode signal, and
wherein the logic circuit generates the enable signal in response to the refresh signal and the mode signal.

2. The memory device of claim 1, wherein:
when the memory device operates in a power-down mode, the mode signal has the first logic level, and
when the memory device does not operate in the power-down mode, the mode signal has the second logic level.

3. The memory device of claim 2, wherein:
when the memory device operates in a self-refresh mode, the refresh signal has the first logic level, and
when the memory device does not operate in the self-refresh mode, the refresh signal has the second logic level.

4. The memory device of claim 3, wherein the logic circuit generates the enable signal having the first logic level in response to the mode signal having the second logic level and the refresh signal having the second logic level, and generates the enable signal having the second logic level in response to at least one of the mode signal having the first logic level and the refresh signal having the first logic level.

5. The memory device of claim 3, wherein the logic circuit comprising:
a NOR logic gate, wherein a first input terminal of the NOR logic gate receives the refresh signal, wherein a second input terminal of the NOR logic gate receives the mode signal, wherein an output terminal of the NOR logic gate is used to output the enable signal to the fuse voltage generator.

6. A memory device, comprising:
a fuse voltage generator, configured to generate a fuse voltage in response to an enable signal having a first logic level, and stop generating the fuse voltage in response to the enable signal having a second logic level;
a fuse storage, coupled to the fuse voltage generator, configured to storage a setting data of the memory device, and output the setting data in response to the fuse voltage; and
a logic circuit, coupled to the fuse voltage generator, configured to determine a logic level of the enable signal in response to at least two operating signals,
wherein the at least two operating signal includes an operating command signal and a mode signal, and
wherein the logic circuit generates the enable signal in response to the operating command signal and the mode signal.

7. The memory device of claim 6, wherein:
when the memory device operates in a power-up mode, the mode signal has the second logic level, and
when the memory device completes the power-up mode, the mode signal has the first logic level.

8. The memory device of claim 7, wherein:
when the memory device does not receive the operating command signal, the logic circuit generates the enable signal having the first logic level, and
when the memory device receives the operating command signal after completing the power-up mode, the logic circuit generates the enable signal having the second logic level.

9. The memory device of claim 8, wherein:
when the memory device operates in the power-up mode, the logic circuit generates the enable signal having the first logic level.

10. The memory device of claim 6, wherein the logic circuit comprising:
a latch circuit, wherein a first input terminal of the latch circuit receives the mode signal,
wherein a second input terminal of the latch circuit receives the operating command signal,
wherein an output terminal of the latch circuit is used to output the enable signal to the fuse voltage generator.

11. The memory device of claim 10, wherein latch circuit comprising:
a first NAND logic gate, wherein a first input terminal of the first NAND logic gate receives the mode signal, wherein a second input terminal of the first NAND logic gate receives the operating command signal;
a second NAND logic gate, wherein a first input terminal of the second NAND logic gate is coupled to an output terminal of the first NAND logic gate; and
a third NAND logic gate, wherein a first input terminal of the third NAND logic gate is coupled to an output terminal of the second NAND logic gate, wherein a second input terminal of the third NAND logic gate receives the mode signal, wherein an output terminal of the third NAND logic gate is coupled to a second input terminal of the second NAND logic gate and the fuse voltage generator.

* * * * *